United States Patent
Warren et al.

(10) Patent No.: US 8,723,035 B2
(45) Date of Patent: May 13, 2014

(54) VIBRATION REDUCTION RIB

(75) Inventors: Gary Warren, Aurora (CA); Darren Van Roon, Bowmanville (CA); Allan Chun, Brooklin (CA); Steve Steane, Courtice (CA); Reginald C. Grills, Oshawa (CA)

(73) Assignee: Flextronics AP, LLC, Broomfield, CO (US)

( * ) Notice: Subject to any disclaimer, the term of this patent is extended or adjusted under 35 U.S.C. 154(b) by 64 days.

(21) Appl. No.: 13/601,055

(22) Filed: Aug. 31, 2012

(65) Prior Publication Data

US 2014/0062271 A1    Mar. 6, 2014

(51) Int. Cl.
*H02G 3/08*    (2006.01)
*H05K 5/02*    (2006.01)

(52) U.S. Cl.
CPC ............ *H02G 3/08* (2013.01); *H02G 3/081* (2013.01); *H05K 5/02* (2013.01); *Y10S 248/906* (2013.01)
USPC ........... 174/50; 174/520; 439/76.1; 439/76.2; 248/906

(58) Field of Classification Search
CPC ......... H05K 5/00; H05K 5/04; H05K 5/0013; H05K 5/02; H05K 5/0204; H05K 7/12; H05K 7/1401; H05K 7/14; H02G 3/08; H02G 3/10; H02G 3/081; H02G 3/086
USPC ................. 174/520, 17 R, 53, 57, 58, 59, 50; 439/76.1, 76.2, 949, 467; 248/906, 248/221.11, 222.12, 222.52, 222.11, 200, 248/205.1, 222.51; 220/3.2–3.9, 4.02; 361/600, 679.01, 796, 801, 807, 730, 361/740
See application file for complete search history.

(56) References Cited

U.S. PATENT DOCUMENTS

| | | | | |
|---|---|---|---|---|
| 5,950,973 A | * | 9/1999 | Verma | 248/222.51 |
| 6,126,458 A | * | 10/2000 | Gregory et al. | 439/76.2 |
| 6,441,304 B1 | * | 8/2002 | Currier et al. | 174/53 |
| 6,570,088 B1 | * | 5/2003 | Depp et al. | 174/50 |
| 6,833,503 B2 | * | 12/2004 | Lopez et al. | 174/50 |
| 7,232,950 B2 | * | 6/2007 | Kaneko et al. | 174/50 |
| 7,507,094 B2 | * | 3/2009 | Kubota et al. | 439/76.2 |
| 7,718,892 B2 | * | 5/2010 | Warren et al. | 174/50 |

* cited by examiner

*Primary Examiner* — Angel R Estrada
(74) *Attorney, Agent, or Firm* — Volpe and Koenig, P.C.

(57) ABSTRACT

A method and apparatus for connecting a housing unit for an electronics module to an adapter member are disclosed. The method includes providing a housing with a first connection member and a second connection member, wherein the first connection member includes a flex rib and an abuse protection rib, attaching the first connection member to an adapter member, pivoting the housing on the first connection member to allow the second connection member to swing into position, and snapping the second connection member into the adapter member at an adapter member opening.

14 Claims, 11 Drawing Sheets

VIBRATION REDUCTION RIB

CROSS REFERENCE TO RELATED APPLICATION

This application is related to U.S. Pat. No. 7,718,892, issued May 18, 2010, which is hereby incorporated by reference.

BACKGROUND

Vehicle control modules control various aspects of a vehicle, including controlling moving parts, such as seats, windows and rotational closure members, such as lift gates. One of the issues that designers of control modules face includes securing the electronics of the control modules within the vehicle. Generally designers use control module housings to house and secure the control modules.

Control module housings face a number of challenges for securing electronics therein. Control housings are adapted for connection to the automobile and prevent damage to the electronics over extended periods of time and over a variety of environmental conditions, such as heat and moisture, and motion factors. In the case of the control module housing being mounted to moving parts, or non-moving parts, of a vehicle, including doors and lift gates, the housing should be designed to prevent motion including vibration and other dynamic stress factors, from damaging control electronics contained therein as damage may cause vehicle parts to malfunction that are controlled by the control modules. Accordingly, there is a need for a housing to prevent damage to control modules contained within the housing. It is also important that the module does not rattle against the mounting plate, or adapter member, causing unwanted noise. When a mechanical shock is applied to the adapter member, flex ribs may cushion the shock inside the module, reducing the chance of damage to electronic components.

SUMMARY

A method and apparatus for connecting a housing unit for an electronics module to an adapter member are disclosed. The method includes providing a housing with a first connection member and a second connection member, wherein the first connection member includes a flex rib and an abuse protection rib. The first connection member is attached to an adapter member and the housing is pivoted on the first connection member to allow the second connection member to swing into position. The second connection member is snapped into the adapter member at an adapter member opening.

BRIEF DESCRIPTION OF THE DRAWINGS

A more detailed understanding may be had from the following description, given by way of example in conjunction with the accompanying drawings wherein.

DETAILED DESCRIPTION

Figure 1:
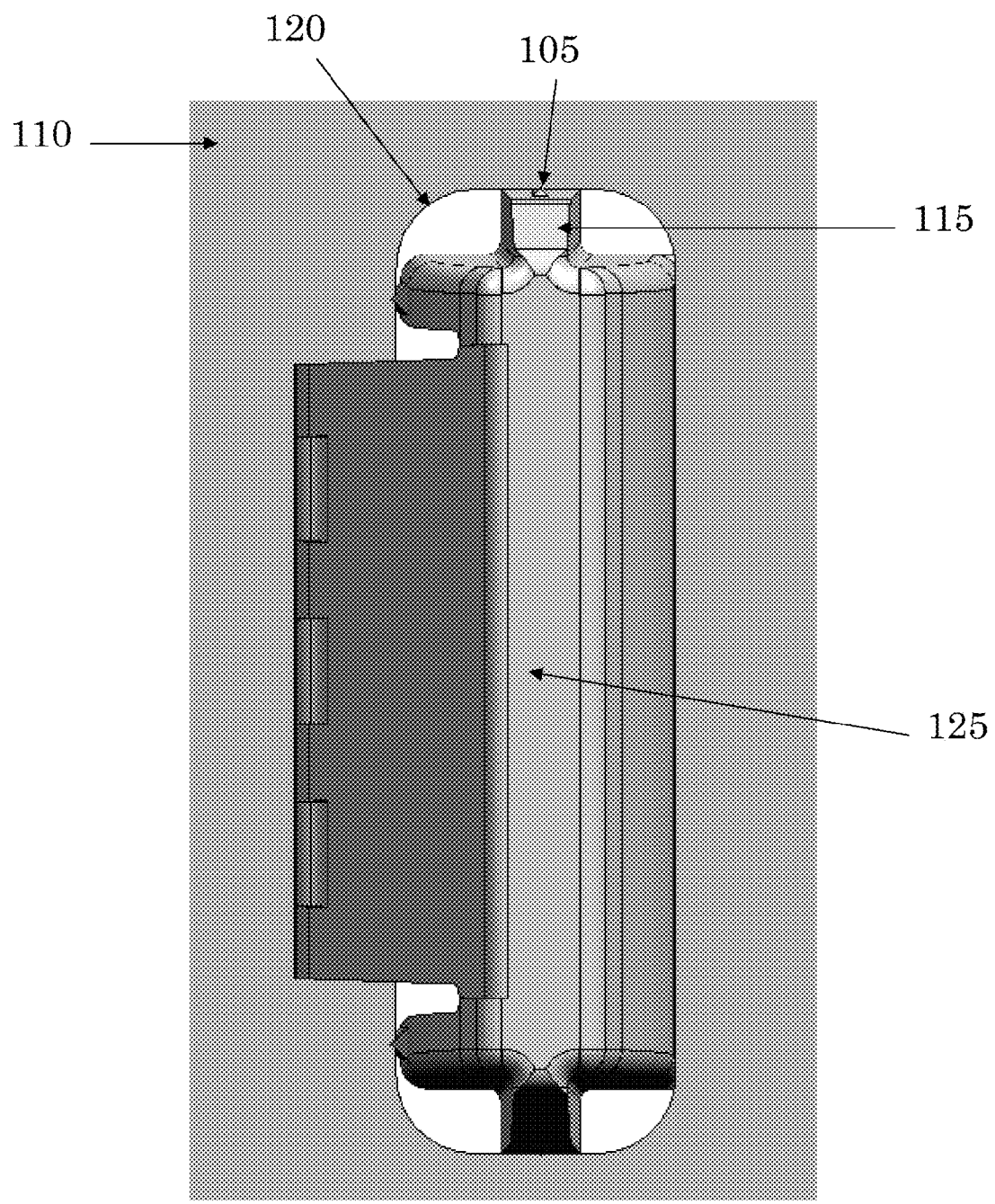
FIG. 1 is an example of a connection member inside of an adapter member utilizing a crush rib.

This invention is described in the following description with reference to the Figures, in which like reference numbers represent the same or similar elements. While this invention is described in terms of modes for achieving this invention's objectives, it will be appreciated by those skilled in the art that variations may be accomplished in view of these teachings without deviating from the spirit or scope of the present invention. The embodiments and variations of the invention described herein, and/or shown in the drawings, are presented by way of example only and are not limiting as to the scope of the invention. Unless otherwise specifically stated, individual aspects and components of the invention may be omitted or modified, or may have substituted therefore known equivalents, or as yet unknown substitutes such as may be developed in the future or such as may be found to be acceptable substitutes in the future. The invention may also be modified for a variety of applications while remaining within the spirit and scope of the claimed invention, since the range of potential applications is great, and since it is intended that the present invention be adaptable to many such variations.

FIG. 1 is an example of a connection member 125 of a control housing inside of an adapter member 110 utilizing a crush rib 105. Crush rib 105 is used to prevent vibration of a connection member 125 by abutting an adapter member opening 120 of adapter member 110. Abuse protection rib 115 provides stability for the crush rib 105. Crush rib 105 is located at the end of abuse protection rib 115. Crush rib 105 interferes with the adapter member opening 120, causing material to be removed from the crush rib 105 during insertion. The removal of the material from crush rib 105 results in a tight fit within the adapter member opening's 120 inner walls.

Currently a crush rib design may be used in which the crush rib is shaved off during insertion of the connection member into the adapter member. The remaining material may compensate for any fluctuating tolerances and provide a vibration resistant fit.

Figure 2:
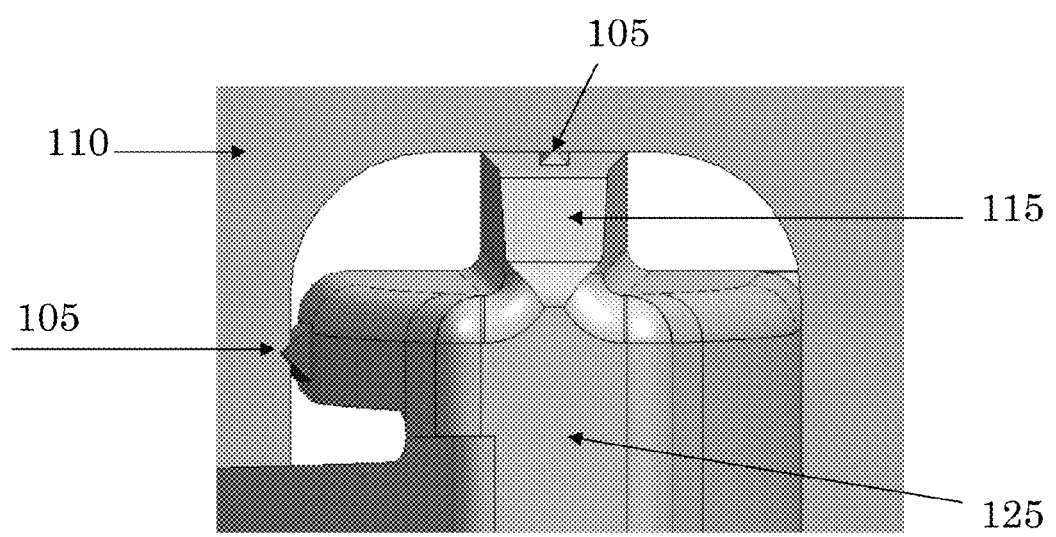
FIG. 2 is a magnified example of a connection member inside of an adapter member utilizing a crush rib.

FIG. 2 is a magnified example of a connection member 125 inside of an adapter member 110 utilizing a crush rib 105. As illustrated in FIG. 2, crush rib 105 is located at the end of an abuse protection rib 115. Crush rib 105 fits into adapter member 110 at the adapter member opening 120. As the crush rib 105 prevents vibration of the connection member 125, more material continues to be removed from the crush rib 105. As more material is removed from the crush rib 105, the connection member 125 may no longer have a tight fit within the adapter member opening's 120 inner walls.

The control housing may lose its tight fit in the adapter member opening over time with use of the crush rib. The loss of the tight fit may be due to the constant vibration slowly removing additional material from the crush ribs over time. As more material is removed from the crush rib, the control housing may come loose from the adapter member opening and may result in rattle.

Described herein is a flex rib that may not be subject to material removal and therefore maintains vibration resistance over a longer period of time. A flex rib may be used on any connection or attachment member to provide a tight, vibration resistant fit of that member.

Figure 3:
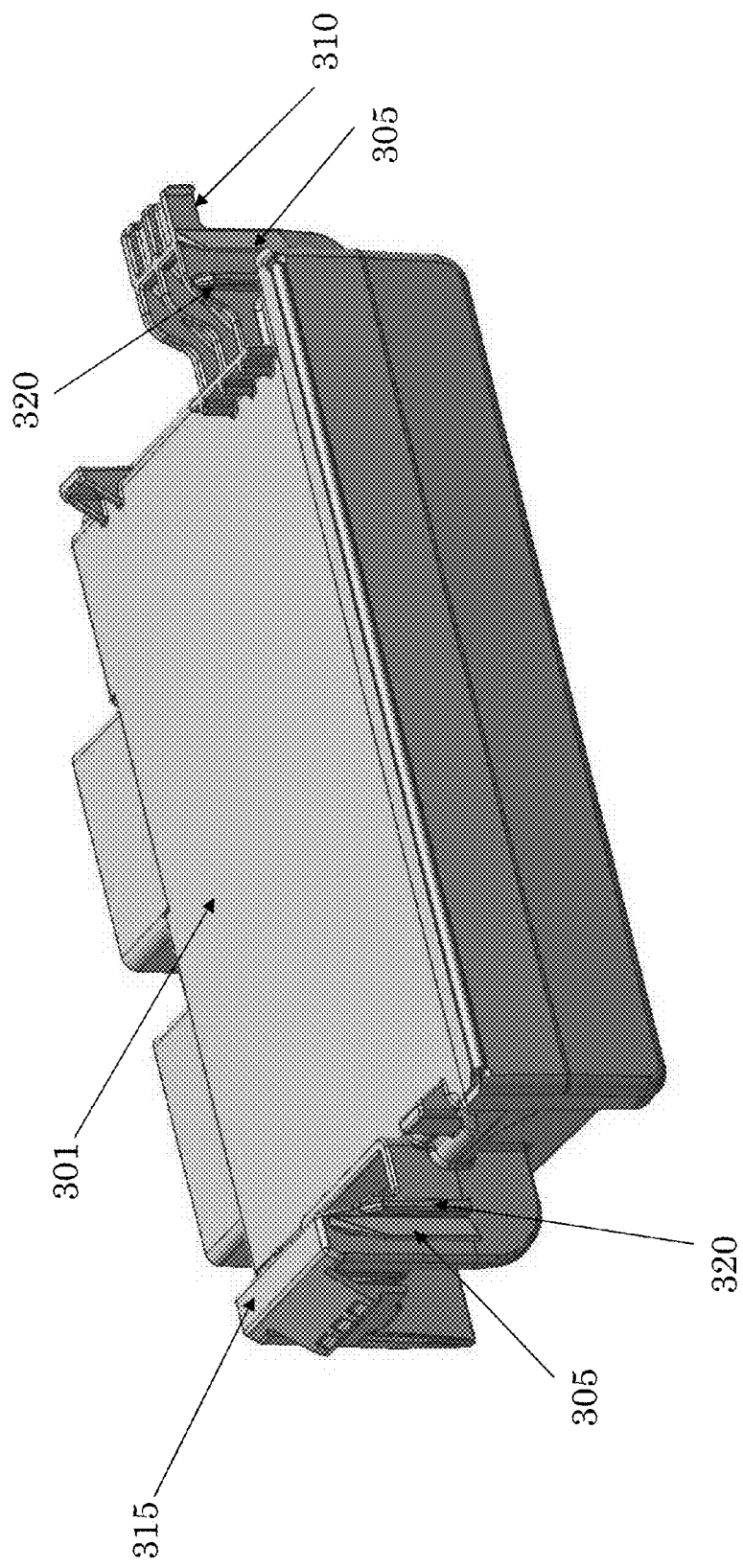
FIG. 3 is an example of a housing used for housing a control module for controlling a device configured to be repositioned.

FIG. 3 is an example of a housing used for housing a control module for controlling a device configured to be repositioned. FIG. 3 illustrates control housing 301 with connection members 310 and 315. Connection member 310 has a dog-leg configuration, allowing the connection member 310 to be hooked into an adapter member opening. Connection member 315 has a snap configuration, allowing the connection member 315 to swing into position and snap into the adaptor member opening. The connection members 310 and 315 may be integral with the control housing 301. For example, they may be formed of the same material at the same time by the same process. Connection member 310 and 315 may include a flex rib 305 and an abuse protection rib 320.

Figure 4:
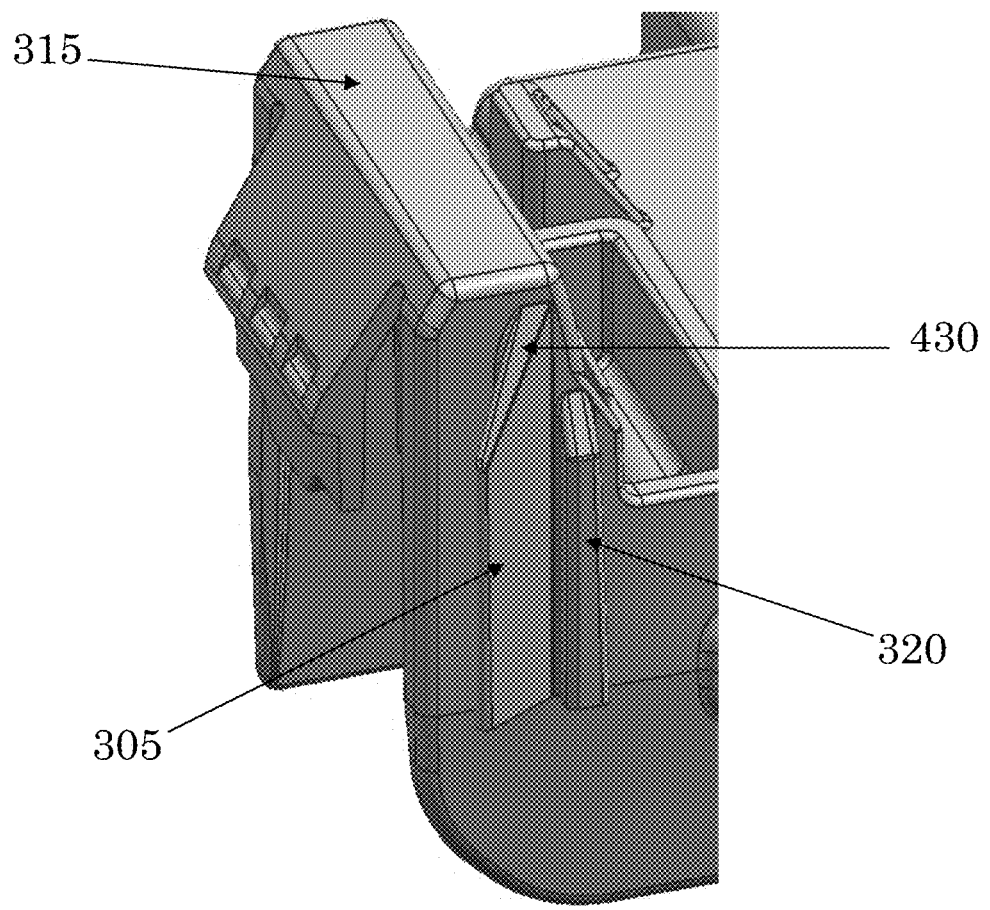
FIG. 4 is a magnified view of connection member.

FIG. 4 is a magnified view of connection member 315. FIG. 4 shows connection member 315 which includes flex rib 305 and abuse protection rib 320. Flex rib 305 includes a lead-in surface 430. The lead-in surface 430 allows for the connection member 315 to easily fit within an adapter member opening.

FIGS. 5-8 illustrate instances of progress for the single motion of attaching the housing to an adapter member.

Figure 5:
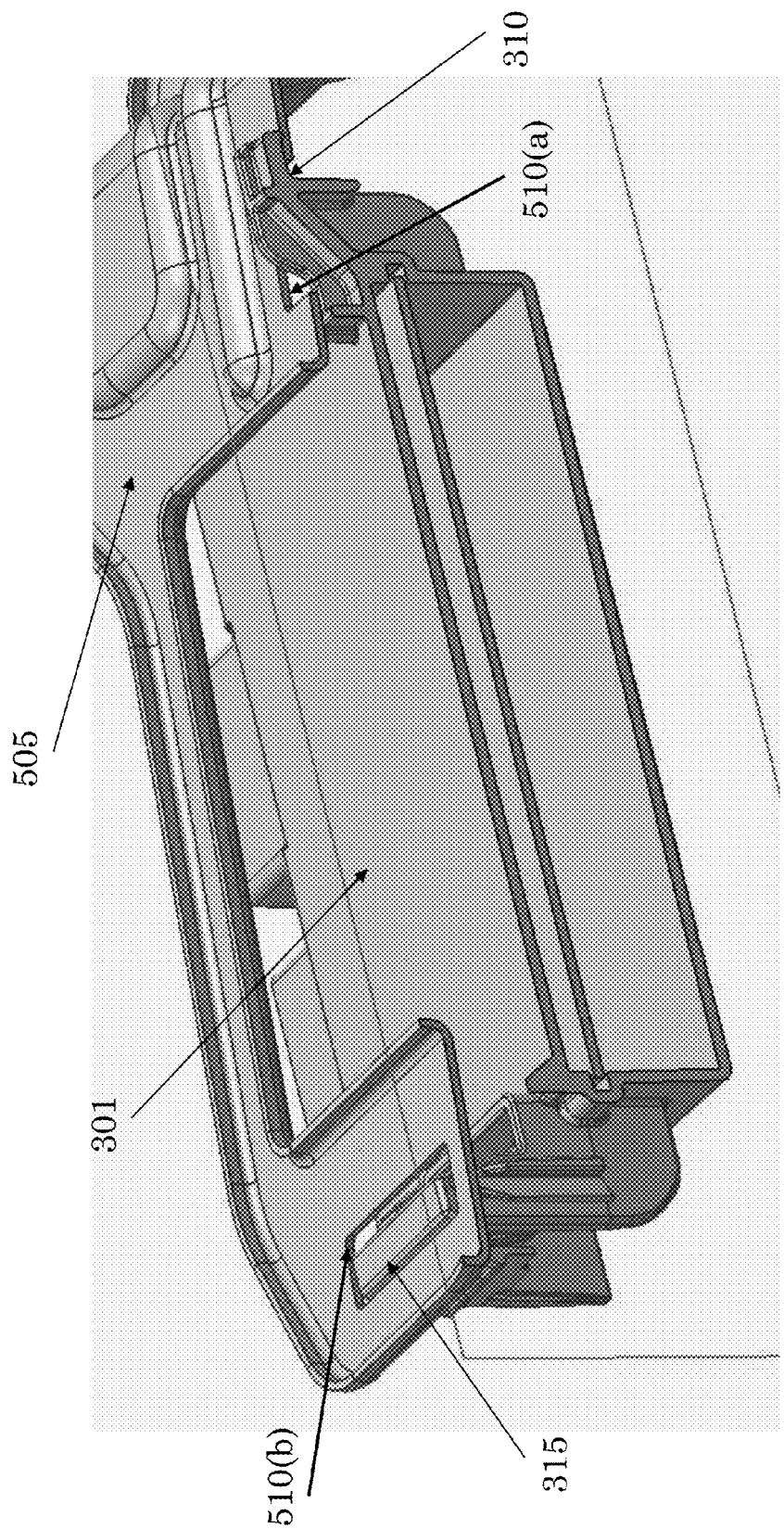
FIG. 5 is an example of a first instance of progress for the single motion of attaching the housing to an adapter member.

FIG. 5 is an example of a first instance of progress for the single motion of attaching the control housing 301 to an adapter member 505. FIG. 5 illustrates that connection member 310 is first hooked into adapter member 505. Once connection member 310 is hooked into adapter member 505 at adapter member opening 510(a), control housing 301 is then pivoted on connection member 310, allowing connection member 315 to swing into position.

Figure 6:
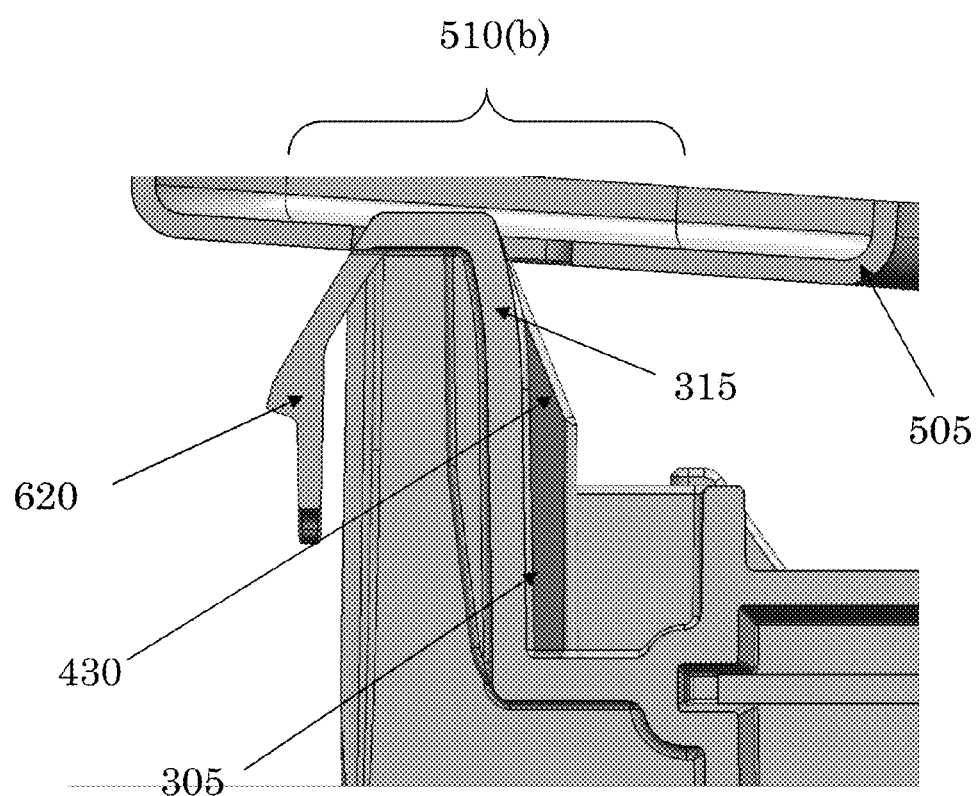
FIG. 6 is an example of a second instance of progress for the single motion of attaching the housing to the adapter member.

FIG. 6 is an example of a second instance of progress for the single motion of attaching the control housing 301 to the adapter member 505. FIG. 6 illustrates adapter member 505 with adapter member opening 510(b). The adapter member 505 is first contacting connection member 315. Connection member 315 includes a snap arm 620, a flex rib 305, and a flex rib lead-in surface 430.

Figure 7:
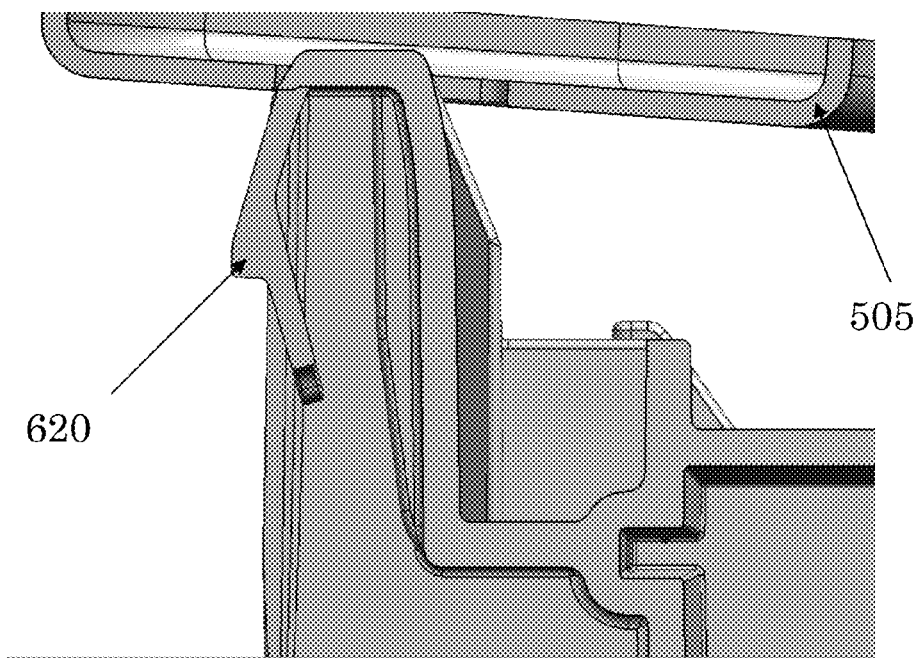
FIG. 7 is an example of a third instance of progress for the single motion of attaching the housing to the adapter member.

FIG. 7 is an example of a third instance of progress for the single motion of attaching the control housing 301 to the adapter member 505. FIG. 7 illustrates snap arm 620 flexing to allow the adapter member 505 to pass.

Figure 8:
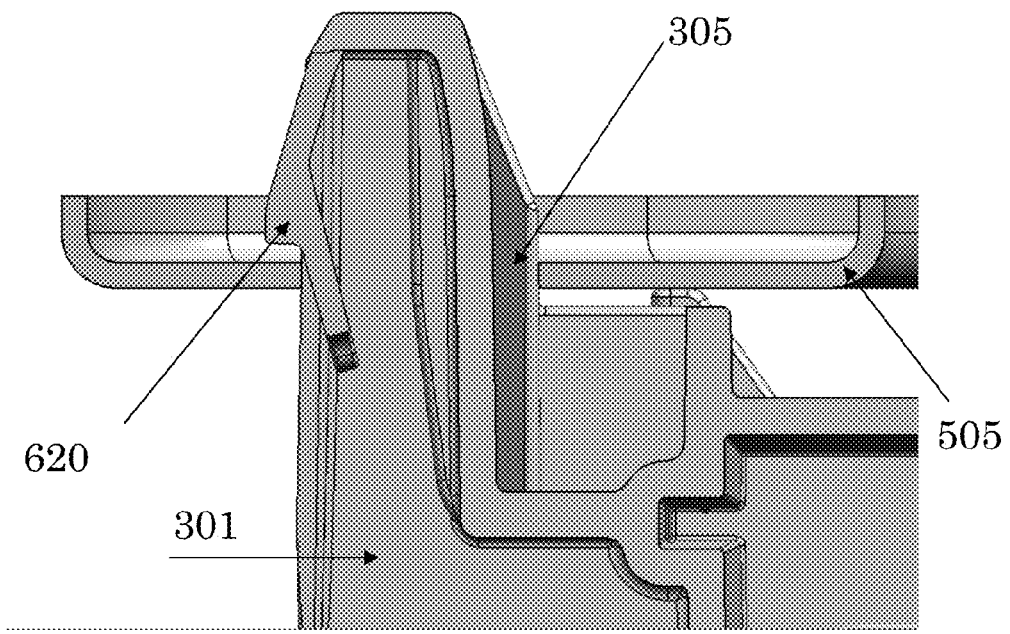
FIG. 8 is an example of a fourth and final instance of progress for the single motion of attaching the housing to the adapter member.

FIG. 8 is an example of a fourth and final instance of progress for the single motion of attaching the control housing 301 to the adapter member 505. FIG. 8 illustrates snap arm 620 engaged with adapter member 505. The snap arm 620 retains control housing 301 vertically within adapter member 505. Flex ribs 305 resist transverse movement and vibration.

Figure 9:
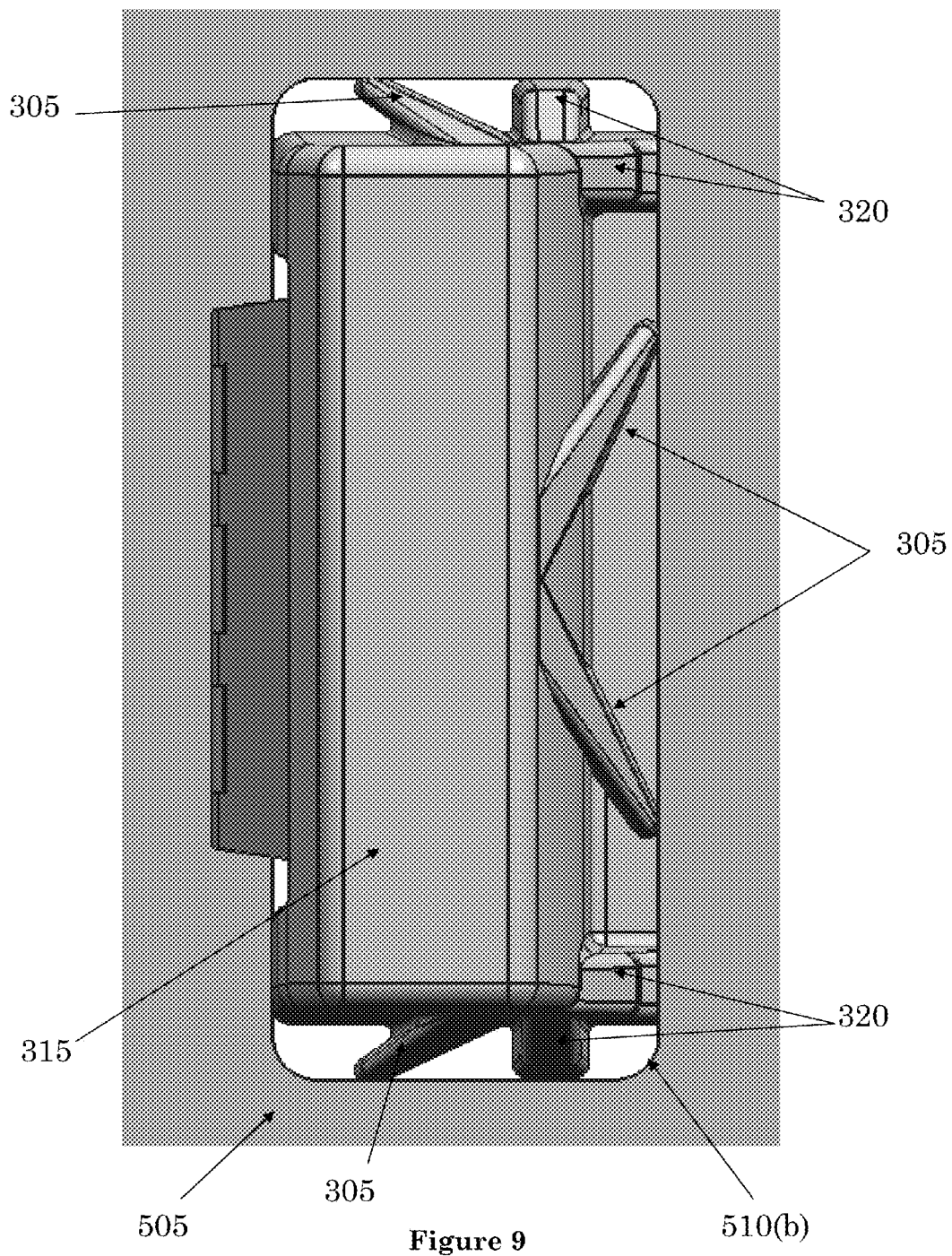
FIG. 9 is an example of a connection member inside of an adapter member utilizing flex ribs and abuse protection ribs.

FIG. 9 is an example of a connection member 315 inside of an adapter member 505 utilizing flex ribs 305 and abuse protection ribs 320. Connection member 315 fits inside adapter member 505 at adapter member opening 510(b). Flex ribs 305 and abuse protection ribs 320 are located at the top and bottom of connection member 315. Flex ribs 305 and abuse protection ribs 320 are also located on the left side of connection member 315.

The connection member 315 is shown engaged within the adapter member opening 510(b). The flex ribs 305 are shown flexed within the adapter member opening 510(b). The designed interference, in-between the flex ribs 305 and the adapter member opening 510(b), may displace the ribs. This displacement may result in a constant feedback force acting against the adapter member opening's 510(b) inner walls. The constant feedback force may resist displacement of the connection member 315 in an environment susceptible to vibration and also absorb shock and reduce its transmission to any shock sensitive components. The abuse protection rib 320 is designed with clearance in-between it and the adapted member opening 510(b) wall. The abuse protection rib 320 may prevent excessive force from displacing the connection member 315 to a point of damaging the flex ribs 305.

Figure 10:
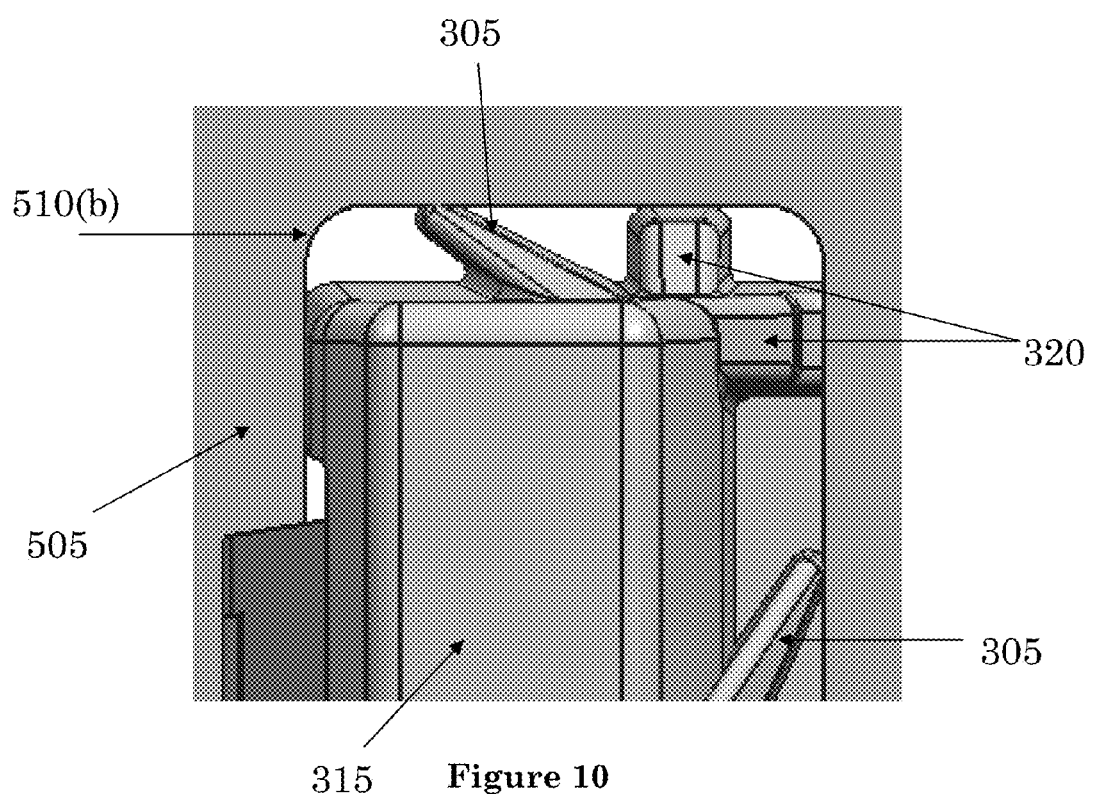
FIG. 10 is a magnified view of FIG. 9.

FIG. 10 is a magnified view of FIG. 9. Flex ribs 305 and abuse protection ribs 320 provide a tight fit for connection member 315 in adapter member opening 510(b). FIG. 10 shows the flex ribs 305 flexed within the adapter member opening 510(b). The designed interference displaces the flex ribs 305. This displacement results in a constant feedback force acting against the adapter member opening's 510(b) inner walls. The abuse protection rib 320 may prevent excessive force from displacing the connection member 315 to a point of damaging the flex ribs 305.

Figure 11:
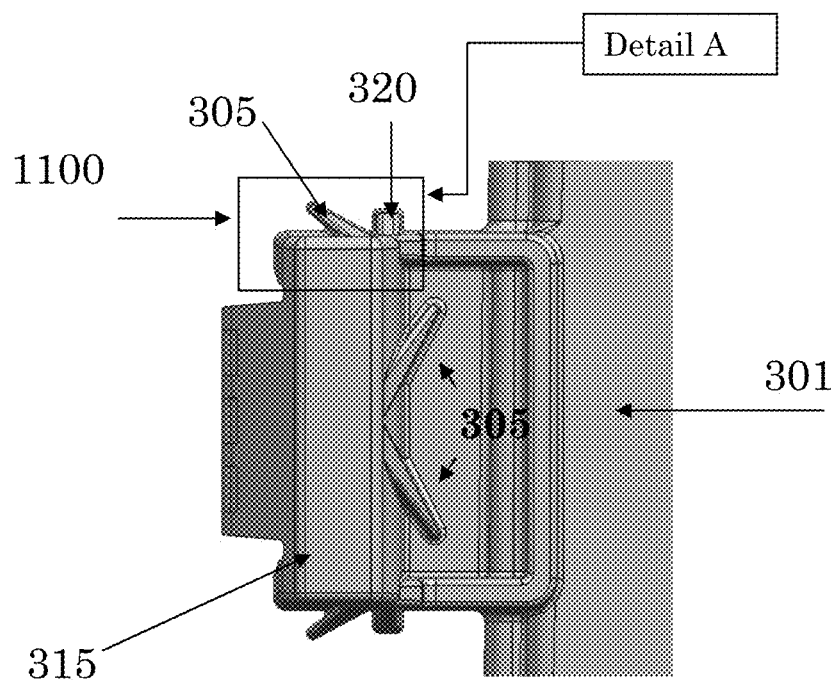
FIG. 11 is a top view example of a control housing utilizing a flex rib.

FIG. 11 is a top view example of a control housing 301 utilizing a flex rib 305. Flex rib 305 is a part of connection member 315. Detail A 1100 includes both flex rib 305 and abuse protection rib 320. Connection member 315 is part of control housing 301. The connection member 315, control housing 301, flex rib 305, and abuse protection rib 320 may be one piece. The connection member 315, control housing 301, flex rib 305, and abuse protection rib 320 may be a plastic, for example, polypropylene.

The flex rib 305 is designed to be flexible and may be displaced with a reasonable amount of force. The abuse protection rib 320 may be used to limit the amount of deflection the flex rib 305 may be displaced. The flex rib 305 includes a lead-in surface to guide the flex rib 305 into an adapter member opening 510(b), allowing the flex rib 305 to be deflected automatically upon insertion.

For example, the flex rib 305 may provide dampening and may minimize movement of a control housing 301 when mounted to a vehicle. By dampening vibrations, electronics, connectors, and other devices are better protected from potential damage of loosening during vehicle operation. In addition, dampening vibrations helps reduce vehicle noise to benefit comfort of passengers within the vehicle.

Figure 12:
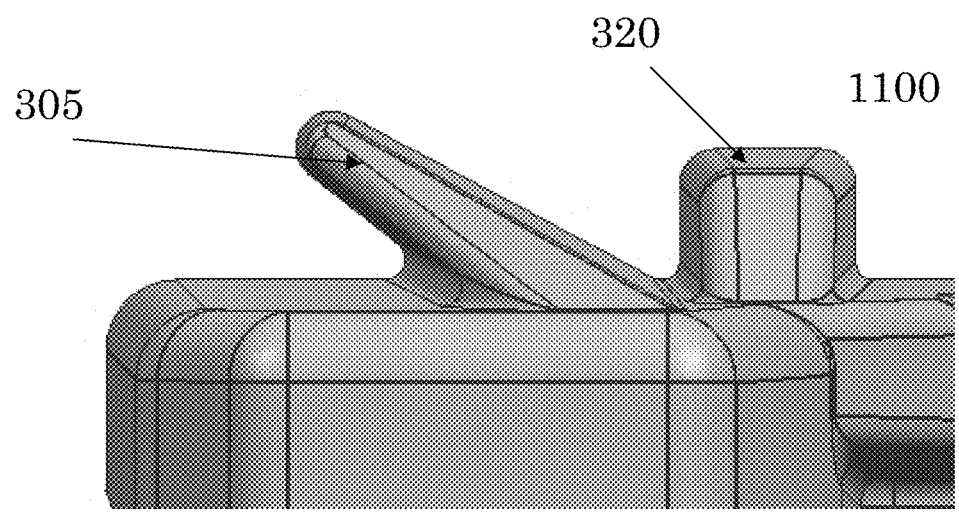
FIG. 12 is a magnified view of Detail A in FIG. 11.

FIG. 12 is a magnified view of Detail A 1100 in FIG. 11. Detail A 1100 includes flex rib 305 and abuse protection rib 320. As illustrated in FIG. 12, the abuse protection rib 320 has a certain height which is less than that of the flex rib 305. This differential in height allows the flex rib 305 to flex all the way to the height of the abuse protection rib 320. This limits the amount of deflection the flex rib 305 may be displaced.

Figure 13:
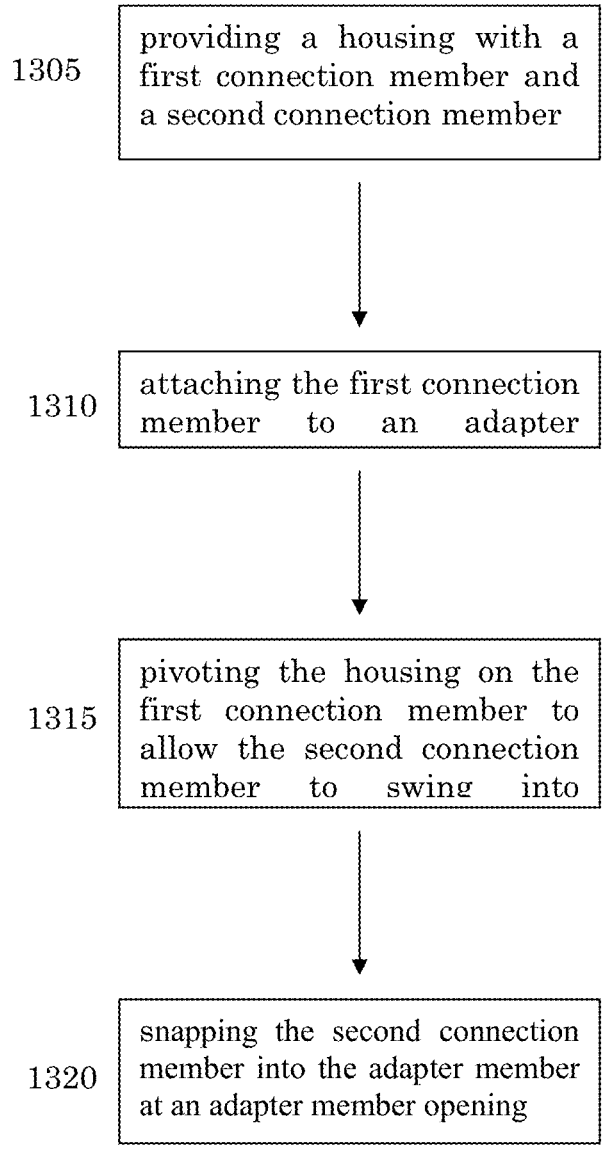
FIG. 13 is a flow diagram of an example method for connecting a housing unit for an electronics module to an adapter member.

FIG. 13 is a flow diagram of an example method 1300 for connecting a housing unit for an electronics module to an adapter member. The method 1300 includes providing a housing with a first connection member and a second connection member 1305. The first connection member may include a flex rib and an abuse protection rib. The method 1300 may further include attaching the first connection member to an adapter member 1310. The method 1300 may further include pivoting the housing on the first connection member to allow the second connection member to swing into position 1315.

The method 1300 may further include snapping the second connection member into the adapter member at an adapter member opening 1320.

Those of ordinary skill in the art may recognize that many modifications and variations of the above may be implemented without departing from the spirit or scope of the following claims. Thus, it is intended that the following claims cover the modifications and variations provided they come within the scope of the appended claims and their equivalents.

What is claimed:

1. A housing unit for an electronics module, the housing unit comprising:
   a housing configured to secure electronics of an electronics module;
   a connection member disposed on one side of the housing;
   a flex rib attached to the connection member; and
   an abuse protection rib connected to the connection member, wherein a height of the abuse protection rib is less than a height of the flex rib such that the height of the abuse protection rib limits an amount of deflection of the flex rib.

2. The housing unit of claim 1, wherein the flex rib includes a lead-in surface to guide the flex rib into an adapter member opening.

3. The housing unit of claim 1, wherein the flex rib is displaced with a reasonable amount of force.

4. The housing unit of claim 3, wherein the displacement of the flex rib results in a feedback force to resist displacement of the connection member in an adapter member opening.

5. The housing unit of claim 4, wherein the flex rib prevents the connection member from rattling in the adapter member opening.

6. The housing unit of claim 1, wherein the housing, the connection member, the flex rib, and the abuse protection rib are one piece.

7. The housing unit of claim 1, wherein the housing, the connection member, the flex rib, and the abuse protection rib are made of plastic.

8. A method for connecting a housing unit for an electronics module to an adapter member, the method comprising:
   providing a housing with a first connection member and a second connection member, wherein the first connection member includes a flex rib and an abuse protection rib;
   attaching the first connection member to an adapter member;
   pivoting the housing on the first connection member to allow the second connection member to swing into position;
   snapping the second connection member into the adapter member at an adapter member opening; and
   limiting an amount of deflection of the flex rib with the abuse protection rib.

9. The method of claim 8, wherein the flex rib includes a lead-in surface to guide the flex rib into the adapter member opening.

10. The method of claim 8, wherein the flex rib is displaced with a reasonable amount of force.

11. The method of claim 10, wherein the displacement of the flex rib results in a feed force to resist displacement of the connection member in the adapter member opening.

12. The method of claim 11, wherein the flex rib prevents the connection member from rattling in the adapter member opening.

13. The method of claim 8, wherein the housing, the connection member, the flex rib, and the abuse protection rib are one piece.

14. The method of claim 8, wherein the housing, the connection member, the flex rib, and the abuse protection rib are made of plastic.

* * * * *